United States Patent [19]
Tsuzuki et al.

[11] 4,067,040
[45] Jan. 3, 1978

[54] SEMICONDUCTOR DEVICE

[75] Inventors: Naobumi Tsuzuki; Shinzo Anazawa; Shozo Noguchi, all of Tokyo, Japan

[73] Assignee: Nippon Electric Company, Ltd., Tokyo, Japan

[21] Appl. No.: 749,114

[22] Filed: Dec. 9, 1976

[30] Foreign Application Priority Data

Dec. 12, 1975 Japan ............................... 50-147398

[51] Int. Cl.² ..................... H01L 23/48; H01L 23/02; H01L 39/02
[52] U.S. Cl. ........................................ 357/74; 357/68; 357/80
[58] Field of Search ............................. 357/68, 74, 80

[56] References Cited
U.S. PATENT DOCUMENTS 3,641,398  2/1972  Fitzgerald .............................. 357/68

Primary Examiner—Edward J. Wojciechowicz
Attorney, Agent, or Firm—Hopgood, Calimafde, Kalil, Blaustein & Lieberman

[57] ABSTRACT

A semiconductor device, which provides efficient heat dissipation, includes a semiconductor support member formed of an insulating, thermally conductive material having a projecting portion on the top surface and a first conducting layer extending along the surfaces of the support members from the bottom to the projecting portion. An insulating wall member for installing terminals is disposed on the top surface of the semiconductor support member in areas around the projecting portion. A second conducting layer is formed on the top end face of the wall member, and a hollow portion is provided in the wall member below the second conducting layer.

12 Claims, 7 Drawing Figures

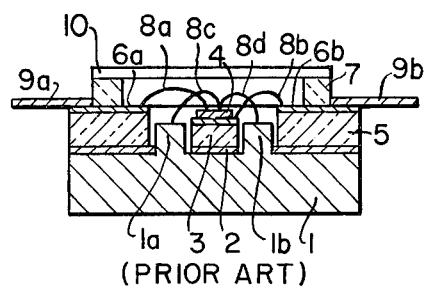
FIG. IA (PRIOR ART)
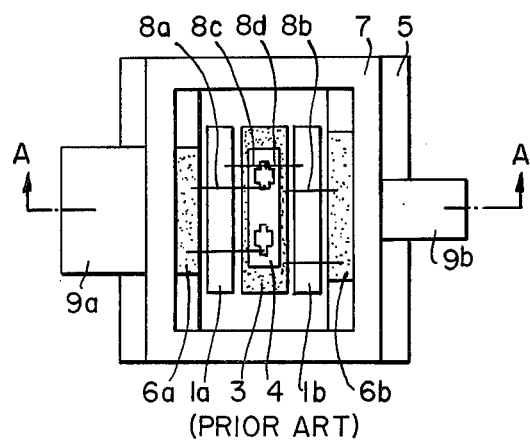
FIG IB (PRIOR ART)
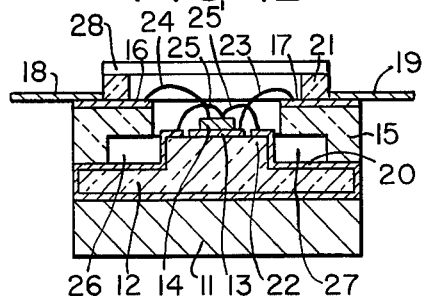
FIG 2A
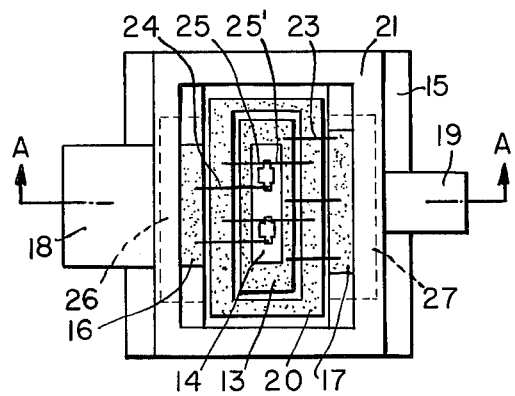
FIG. 2B

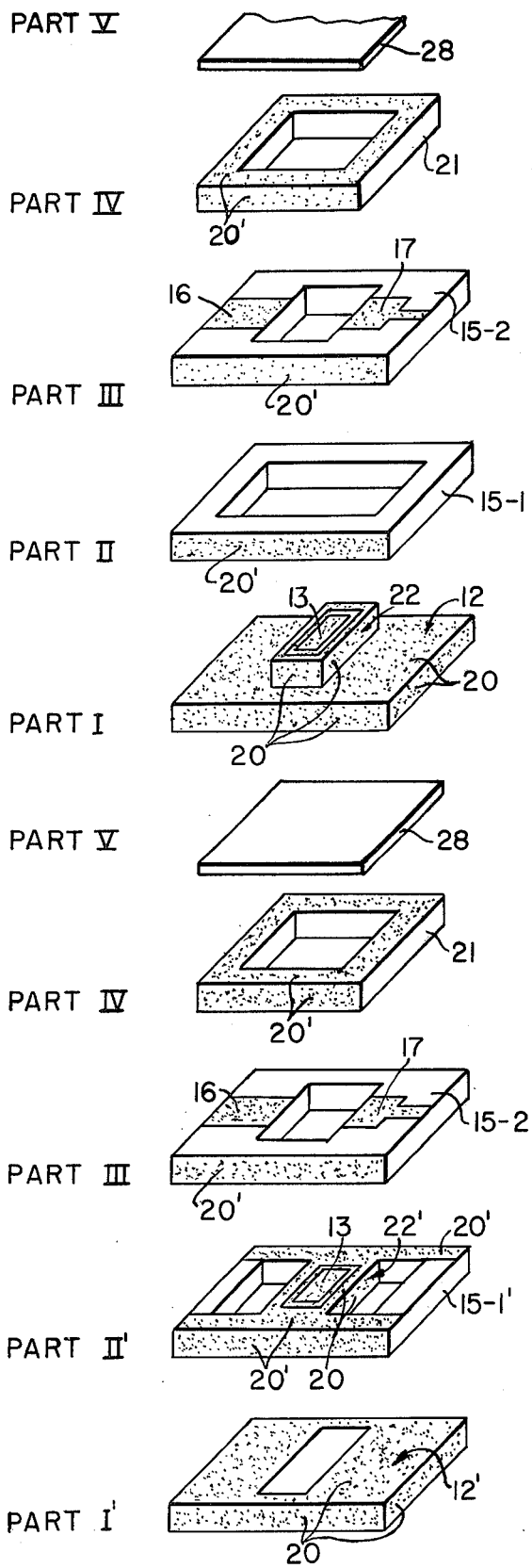
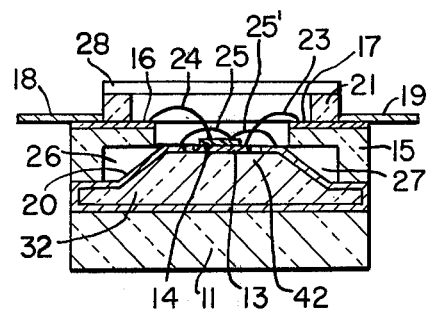
FIG. 2C
FIG. 4
FIG. 3

SEMICONDUCTOR DEVICE

The present invention relates generally to semiconductor devices, and more particularly to a package structure for a high-frequency, high-power semiconductor device.

A semiconductor device generally includes a package structure that permits a semiconductor element housed therein to be connected to external circuits without affecting the characteristics and reliability of the element. To this effect, the parasitic capacitance ascribed to the package and the parasitic inductance ascribed to the connecting wires extending between the semiconductor element and the package must be minimized to preclude parasitic oscillation and any decrease in the gain, output and bandwidth of the device. In addition, heat produced in the semiconductor element must be efficiently dissipated to lower the PN junction temperature of the semiconductor element and thereby maintain the reliability of the device. Prior art designs of semiconductor packages have, however, not been able to meet all of these requirements in a single design.

More specifically, a prior art high-frequency semiconductor device, such as that schematically shown in FIGS. 1A and 1B, has a package structure that is primarily aimed at reducing the common inductance. This prior art device, as shown, comprises a metallic substrate 1 made of a material having a high thermal conductivity such as copper that serves as both an external lead and a heat sink, and rail portions 1a and 1b formed on the central part of the substrate 1. A semiconductor support member 2 made of an electrically insulating and thermally conducting material, such as beryllia ceramic, is installed between the rails. A metallized layer 3 is formed on the semiconductor support member 2, and a semiconductor element 4 is mounted on the metallized layer 3. An insulating wall member 5 for installing terminals is formed surrounding the rails 1a and 1b on the substrate 1. A pair of metallized layers 6a and 6b are formed on the upper end face of the wall member 5. The metallized layers 6a and 6b serve to attach an input lead 9a and an output lead 9b. The geometries of the metallized layers can be arbitrarily controlled to match the impedance of the semiconductor element to an external circuit impedance.

The prior art device further comprises a framelike insulating substrate 7 for supporting a cap member 10, which hermetically seals the semiconductor element. Electrical connections between external circuits and the semiconductor element 4 mounted on the metallized layer 3 are made in the following manner. Assuming that the semiconductor element 4 is of a bipolar transistor, the output electrode (e.g., collector) of the element 4 is connected to the metallized layer 3 which, in turn, is electrically connected to the metallized layer 6b via a plurality of connecting wires 8b, and the metallized layer 6b is connected to an external circuit via the output external lead 9b. On the input side, the input electrode (e.g., base) of the semiconductor element 4 is electrically connected to the metallized layer 6a via connecting wires 8a, and the metallized layer 6a is connected to an external circuit via the input external lead 9a. The common electrode (e.g., emitter) of the element 4 is connected by way of connecting wires 8c and 8d and rails 1a and 1b to the metallic substrate 1.

As mentioned above, parasitic inductance and capacitance must be minimized to assure the high-frequency characteristics of the high-frequency semiconductor device. To this effect, the common inductance ascribed to the connecting wires 8c and 9d must be minimized and the lengths of these wires must be reduced by reducing the distance between the rails 1a and 1b. But, if this distance is reduced, the width of the semiconductor support member 2 would become narrow, and the heat produced in the semiconductor element 4 cannot be dissipated well to the heat sink substrate 1, because there would remain substantially no lateral thermal path. As a result, the semiconductor support member 2 shows a high thermal resistance, forcing the semiconductor element 4 to operate at a high PN junction temperature. The higher the output of the semiconductor device, the greater is the influence of the thermal resistance of the semiconductor support member 2. One solution to this problem would be to reduce the thickness of the semiconductor support member 2. This approach, however, results in larger parasitic capacitance between the metallized layer 3 and the metallic substrate 1, which serves as an external lead to the ground potential. In addition, cracks would tend to develop in a reduced thickness semiconductor support member 2.

To operate the bipolar transistor efficiently in the VHF or UHF band, it is desirable that the input side be maintained capacitive, and the output side be maintained inductive. For this purpose, prior art techniques have proposed a package structure in which the area of the metallized layer 6a is increased to make the input side capacitive and the area of the metallized layer 6b is reduced to make the output side inductive. At a high frequency above 4 GHz, however, the characteristic of the semiconductor device becomes unstable due to parasitic components introduced by the metallized layers 6a and 6b. Accordingly, it is desirable to make the parasitic components as small as possible to stabilize the characteristics of the semiconductor device. With the parasitic components made small, an impedance-matching network to match the impedance of the semiconductor element to the external circuit impedance can be freely appended inside the package. Whereas, in the illustrated prior art structure, the parasitic component, particularly the parasitic capacitance ascribed to the metallized layers 6a and 6b, is equal to or larger than that ascribed to the semiconductor support member 2, causing the semiconductor device 4 to operate unstably at high frequencies.

Briefly described, the prior art package is impractical in that decreasing the common inductance to allow the semiconductor device to be efficiently operated at a high frequency impairs the heat-dissipation efficiency of the device, whereas decreasing the thermal resistance and the common inductance impair the parasitic capacitance between the metallized layer 3 and the metallic substrate 1. Furthermore, the parasitic capacitance between the substrate 1 and the metallized layers 6a and 6b increases, causing the characteristics of the semiconductor device to become unstable at high frequencies.

Accordingly, it is an object of the invention to provide a semiconductor device capable of efficiently dissipating heat produced in the semiconductor element without increasing the common inductance.

It is another object of the invention to provide a semiconductor device capable of efficiently dissipating heat produced in the semiconductor element and yet permitting the parasitic capacitance to be reduced.

In the semiconductor device of the invention, the efficiency in dissipating heat produced in the semiconductor element is increased by making the area of the substrate on which the semiconductor element is mounted sufficiently wide if a material of the same thermal conductivity is used for the substrate, and that an increase in parasitic components produced in the semiconductor device operated at high frequencies is prevented by reducing the parasitic inductance by using the shortest possible connecting wires to make electrical connections between the semiconductor element and the metallized layers and by reducing the parasitic capacitance through the provision of a void space, which has a minimum dielectric constant, in an insulating member.

More particularly, the semiconductor device of the invention comprises a semiconductor support member formed of an insulating, thermally conductive material having a projected portion on the top surface and equipped with a conducting layer extended from the bottom to the projected portion along the surfaces. An insulating wall member for installing terminals is disposed on the top surface of the semiconductor support member in areas around the projected portion. Another conducting layer is formed on the top end face of the wall member. A hollow portion is provided at least between the conducting layer of the wall member and the conducting layer of the semiconductor support member running under the wall member.

The semiconductor device of the invention is now described in the following specification, as considered with the accompanying drawings, in which:

FIGS. 1A and 1B are, respectively, a cross-sectional view and a plan view of a prior art semiconductor device, FIG. 1A being a cross section taken along the line A—A as viewed in the direction of the arrows in FIG. 1B (cap member 10 is omitted);

FIGS. 2A and 2B are, respectively, a cross-sectional view and a plan view of a semiconductor device according to a first embodiment of the invention, FIG. 2A being a cross section taken along the line A—A and viewed in the direction of the arrows in FIG. 2B (cap plate 28 is omitted), and FIG. 2C is a perspective view of the components of this semiconductor device;

FIG. 3 is a perspective view of the components of a semiconductor device according to a second embodiment of the invention; and FIG. 4 is a cross-sectional view of a semiconductor device according to a third embodiment of the invention.

Preferred embodiments of the invention are described by referring to FIGS. 2 to 4 of the accompanying drawings wherein like constituent components are indicated by the same reference numerals.

The embodiment of the invention illustrated in FIGS. 2A and 2B includes an insulator substrate 12, which supports a semiconductor element 14. The substrate 12 is preferably made of a beryllia ceramic and has a projected portion 22 at the central part of its upper surface. A metallized layer 13 is formed on the central part of the upper surface of the projected portion 22, and a collector electrode of a transistor element 14 is connected to layer 13. Another metallized layer 20 used as a common layer is formed over almost all the remaining surface of the insulator substrate 12, extending from the upper surface of the projected portion 22 via the upper and side faces to the bottom surface of the substrate 12. Layer 20 is separated from the collector metallized layer 13 by a given, uniform distance at the upper face of the projected portion 22. The common metallized layer 20 must extend from the upper face of the projected portion 22 to the bottom face of the substrate 12 to be electrically led out there, but it is desirable for layer 20 to cover the surface of the substrate as widely as possible, thereby to reduce the inductance of the common layer.

A metallic plate 11 of a high thermal conductivity material, such as copper, is coupled with the bottom surface of the insulator substrate 12 by being connected to the common layer 20. Plate 11 serves both as a heat sink for the insulator substrate 12 and as an electrical lead out for the common layer 20. The area of the upper surface of the projected portion 22 is made sufficiently larger than the mounted area of the semiconductor element 14 thereon to enable heat generated to the semiconductor element to be broadly dissipated to the substrate 12 and sufficiently transferred to the heat sink 11. A wall member 15 made of an alumina ceramic for installing terminals is attached to the ground layer 20 at the circumference of the top face of the substrate 12 so as to surround the projected portion 22.

A pair of metallized layers 16 and 17 used for electrical lead-out connection to the electrodes of the transistor element 14 and for installing terminals are formed on the upper end surface of the wall member 15. The wall member 15 has hollows or recesses 26 and 27 formed therein by partially reducing the thickness of the lower portion of the wall member 15 in contact with the common layer 20 underneath the metallized layers 16 and 17, respectively. Thus, the wall member 15 has a smaller area on its bottom end than on its upper end. It is desirable that the height of the hollows 26 and 27 be at least half the height of the wall member 15 for the purpose of reducing parasitic capacitance formed between the common layer 20 and each of the metallized layers 16 and 17. For this purpose, the hollows in the wall member 15 are only needed at a portion underneath the metallized layer formed on the upper end surface of the wall member, or between this layer and the common layer. For the same purpose, the inner end of the wall member 15 should not extend beyond the edge of the projected portion 22 to above the upper surface of the projected portion 22. The depth of the hollows 26 and 27 should be as large as possible to the extent that the mechanical strength of the wall member 15 per se and of the attachment between the wall member 15 and the substrate 12 is practically retained.

A framelike insulating member 21 is installed on the upper end surface of the wall member 15, and a cap plate made of a ceramic or metal is attached to this insulating member 21 to hermetically seal the package. External leads 18 and 19 are bonded to the metallized layers 16 and 17, respectively, outside the insulating frame 21 on the upper end surface of the wall member 15. The transistor element 14 is mounted on the metallized layer 13 on the projected portion 22. The collector electrode of the transistor is thus connected to the metallized layer 13 which is, in turn, electrically connected to the metallized layer 17 on the wall member by connecting wire 23 and to the output lead 19. The emitter electrode of the transistor is electrically connected to the common layer 20 by connecting wires 25 and 25' and to the metallic plate 11. The base electrode of the transistor 14 is electrically connected to the metallized layer 16 on the wall member by connecting wire 24 and to the input lead 18.

In this construction, because the semiconductor element 14 is located in the center of the projected portion 22 whose surface area is sufficiently larger than the mounting area of the semiconductor element 14, heat generated therein can dissipate laterally as well as vertically. In addition, the insulator substrate 12 is in contact with the heat sink plate 11 in a larger area than in the prior art construction, thus enhancing the heat-dissipation efficiency. Furthermore, in the prior art construction, as shown in FIGS. 1A and 1B, the distance between the rails 1a and 1b, i.e., the width of the semiconductor support member 2, must be as small as possible to reduce the lengths of the connecting wires 8c and 8d and thereby to reduce the common inductance to the extent that the semiconductor element 4 is barely mounted, that is, less than 1 mm. In contrast, in the semiconductor device according to the invention, the common layer 20 is formed also on the top of the projected portion 22 and hence the width of the upper surface of the projected portion 22 can be expanded to as wide as 3 to 6 mm. As a result, in a semiconductor device having a 20-watt high frequency output rating, for example, the thermal resistance measured was 3.1° C/W with the common inductance maintained as small as 0.05 nanohenry, as opposed to a thermal resistance of 4.2° C/W in the prior art construction. This signifies the fact that the semiconductor device of the invention can operate at a lower PN junction temperature than the prior art equivalent by at least 20° C.

The height of the projected portion 22 of the insulator substrate 12 may be relatively arbitrarily increased, unlike the prior art construction in which the thickness of the semiconductor support member 2 is reduced to improve heat-dissipation efficiency. In the semiconductor device of the invention, therefore, the parasitic capacitance between the collector metallized layer 13 and common lever 20 cannot present a problem. It is desirable that the top of the semiconductor element 14 be flush with the surfaces of the metallized layers 16 and 17 on the wall member 15 in order to minimize the lengths of the connecting wires 24 and 23. This requirement can be readily met in the device of the invention by forming the projected portion 22. In addition, the height of the wall member 15 can be increased because the wall member 15 is installed at a level lower than the top of the projected portion 22. The increased height of the wall member 15 serves to reduce the parasitic capacitance between the metallized layer 20 and the metallized layers 16 and 17, as well as to permit the hollows 26 and 27 to be formed therein. These hollows serve as void spaces offering minimum dielectric constant between the metallized layer 20 and the metallized layers 16 and 17, thus enabling the parasitic capacitance present therein to be considerably reduced. In a construction using an alumina ceramic wall member of 0.5 mm in height with a metallized layer of 2.5 mm ×7 mm in area, the parasitic capacitance without a hollow as measured at 3.1 pF, whereas that with a hollow of 0.25mm in height and 1.25mm in depth was measured at about 1.8 pF.

The ceramic construction of the embodiment shown in FIG. 2A can be fabricated, for example, by the use of ceramic parts I to IV shown in FIG. 2C. Referring to FIG. 2C, part I is the insulator substrate 12 of a beryllia ceramic having a projected portion 22 and metallized layers 13 and 20. Part II is a framelike alumina ceramic member 15-1 forming a lower portion of the wall member 15, its short sides constituting thinner walls to form the hollows. The outer side faces of the long sides have a metallized layer 20'. Part III is a framelike alumina ceramic member 15-2 forming the upper portion of the wall member 15, its short sides constituting thicker walls to form the eaves of the hollows. The upper surfaces of wide, short sides of member 15-2 have the metallized layers 16 and 17, and the outer side faces of the long sides of member 15-2 are covered with a metallized layer 20'. Part IV is the framelike cap support 21 with its upper face and two side faces covered with a metallized layer 20'. The parts I to IV are laminated together in this order. The outer side faces of the long sides of all the parts I to IV become flush with each other, and the metallized layers 20' are connected to each other and to the common layer 20. Therefore, if a metal cap plate 28 of the part V is bonded to the upper face of the cap support 21, the cap 28 and the heat sink plate 11 are established at the same electric potential.

The semiconductor device of the second embodiment illustrated in FIG. 3 is similar to that of the first-described embodiment, with part I' and part II' of its ceramic construction being employed in place of the part I and part II of the ceramic construction of the first embodiment. Part I' is a flat portion 12' of the insulator substrate 12, and part II' includes a projected portion 22' of the insulator substrate 12 and a lower portion 15-1' of the wall member 15. According to this embodiment, all the parts are of flat construction, thus permitting the device to be manufactured efficiently at low cost. A metallized layer 20' formed on the upper and side faces of the long sides of the lower wall portion 15-1' connects the common layer 20 on the projected portion 22' to the common layer 20 at the side faces of the flat substrate portion 12' rather than the upper face of the flat substrate portion 12', which makes it possible to substantially reduce the length of the high-frequency path led to ground. As a modified form of the second embodiment, the lower wall portion 15-1' may be separated from the projected portion 22' in part II'. In this case, the use of a beryllia ceramic only for the projected portion 22' will lower the cost of the device.

In the third embodiment of the invention shown in FIG. 4, a trapezoidal projected portion 42 is provided on an insulator substrate 32, enabling the heat generated in the semiconductor element 14 to be efficiently dissipated.

While a few specific embodiments of the invention are described above, it is apparent that the invention is not to be limited to the geometries and materials disclosed, including the shapes of the projected portions 22 and 42. For example, the common layer 20 need not always be formed over greater portions of the surface of the insulator substrate, because the purpose of this layer is to reduce the common inductance to a substantially negligible value.

The semiconductor device of the invention is not only applicable to a bipolar semiconductor device but also to such other semiconductor devices as the unipolar type, such as a field-effect transistor, wherein a common metallized layer is formed over the surfaces of the insulator substrate, or a metallic substrate is used in place of the insulator substrate. The common electrode of the unipolar element is connected to the common layer or the metallic substrate, whereas the other (e.g., input and output) electrodes thereof are connected by connecting wires to metallized layers on the wall member.

According to the invention, as has been described above, the heat-dissipating efficiency of the semiconductor device can be increased without increasing the common inductance, and the parasitic capacitance between the metallized layers can be considerably reduced. The package of the invention therefore is ideal for use with high-frequency, high-power semiconductor devices.

What is claimed is:

1. A semiconductor device comprising an insulator substrate having a first surface, a projected portion centrally located on said first surface, and a bottom face on the opposite side to said first surface; an insulating wall member mechanically coupled with said first surface of said insulator substrate and surrounding said projected portion, said wall member having a height not lower than that of said projected portion and the thickness of said wall member being less at a portion near said first surface that at a distant portion; a first metallized layer formed on a portion of the top surface of said projected portion of said insulator substrate;
   a second metallized layer formed on said insulator substrate and extending from the peripheral portion of the top surface of said projected portion through said first surface to said bottom face, and a second metallized layer passing under said insulating wall member at said first surface;
   a semiconductor element having a plurality of electrodes and disposed on said first metallized layer on said projected portion;
   means for electrically connecting an electrode of said semiconductor element to said second metallized layer;
   at least a third metallized layer formed on the upper end surface of said insulating wall member;
   means for electrically connecting another electrode of said semiconductor element to said third metallized layer; and
   means coupled with said insulating wall member for hermetically sealing said semiconductor element.

2. The device of claim 1, in which said insulator substrate is comprised of an insulating material having a high thermal conductivity.

3. The device of claim 2, in which said insulator substrate and said wall member are formed of a ceramic.

4. The device of claim 2, in which said second metallized layer covers substantially the whole first surface except for said projected portion and the whole bottom face of said insulator substrate.

5. The device of claim 3, further comprising a metallic body having a high thermal conductivity and coupled with said bottom face of said insulator substrate with electrical connection to said second metallized layer, and at least one external lead connected to said third metallized layer.

6. The device of claim 2, in which said first metallized layer is separated from said second metallized layer.

7. The device of claim 2, in which a plurality of said third metallized layers are formed on the upper end face of said wall member.

8. The device of claim 7, in which said plurality of said third metallized layers are electrically connected to different electrodes of said semiconductor element.

9. The device of claim 2, in which a plurality of said third metallized layers are formed on the upper end surface of said insulating wall member and which further comprises means for electrically connecting said first metallized layer to one of said third metallized layers.

10. The device of claim 2, in which the height of the portion of said insulating wall member having a lesser thickness is equal to or higher than that of said distant portion of said insulating wall member.

11. A semiconductor device comprising an insulator substrate formed of a thermally conductive ceramic material having a projected portion centrally located on one main surface opposite to the other main surface, thereby providing a first surface at the periphery of said one main surface, a second surface on said projected portion, and a third surface on said other main surface; a wall member of an insulating ceramic material and coupled with said first surface of said insulator substrate, surrounding said projected portion, said wall member having a wider portion at its upper end and a narrower portion at its lower end, thereby providing a hollow between said upper end and said insulator substrate;
   a first conductive layer on the central part of said second surface of said insulator substrate;
   a semiconductor element bonded on said first conductive layer, said semiconductor element having an input electrode, an output electrode, and a common electrode;
   a second conductive layer formed on said insulator substrate, isolated from said first conductive layer, and extending from the peripheral part of said second surface through said first surface to said third surface to said insulator substrate, said second conductive layer running under said lower end of said wall member at said first surface of said insulator substrate;
   a metallic body having a high thermal conductivity connected to said second conductive layer at said third surface of said insulator substrate;
   a third and a fourth conductive layer formed on the upper end face of said wall member;
   means for electrically connecting said common electrode of said semiconductor element to said second conductive layer;
   means for electrically connecting said input electrode of said semiconductor element to said third conductive layer;
   means for electrically connecting said output electrode of said semiconductor element to said fourth conductive layer; and
   means coupled with said wall member for hermetically sealing said semiconductor element.

12. A semiconductor device comprising a metallic substrate having a projected portion generally located on one main surface opposite to the other main surface, thereby providing a first surface on the periphery of said one main surface, a second surface on said projected portion, and a third surface of said other main surface; an insulating wall member coupled with said first surface of said substrate and comprising a first portion surrounding said projected portion of said metallic substrate and mechanically coupled with the lower end surface with said first surface of said metallic substrate and a second portion bonded on the upper end surface of said first portion and extending over the inner side surface of said first portion, thereby forming a hollow between said second portion and said metallic substrate; a semiconductor element having a plurality of electrodes and disposed on said first surface of said metallic substrate; a plurality of metallized layers formed on the upper end surface of said second portion of said insulating wall member, the upper end surface of said metallized layer being not lower than the upper surface of said semiconductor element; means for electrically connecting said electrodes of said semiconductor element to said metallized layers; and means coupled with said insulating wall member for hermetically sealing said semiconductor element.

* * * * *